(12) United States Patent
Bal

(10) Patent No.: US 9,553,570 B1
(45) Date of Patent: Jan. 24, 2017

(54) CRYSTAL-LESS JITTER ATTENUATOR

(71) Applicant: Integrated Device Technology, Inc., San Jose, CA (US)

(72) Inventor: Jagdeep Bal, Saratoga, CA (US)

(73) Assignee: Integrated Device Technology, Inc., San Jose, CA (US)

(*) Notice: Subject to any disclaimer, the term of this patent is extended or adjusted under 35 U.S.C. 154(b) by 191 days.

(21) Appl. No.: 14/566,571

(22) Filed: Dec. 10, 2014

(51) Int. Cl.
| | |
|---|---|
| *H03L 7/06* | (2006.01) |
| *H03K 5/1252* | (2006.01) |
| *H03B 5/08* | (2006.01) |
| *H03B 5/04* | (2006.01) |

(52) U.S. Cl.
CPC ............. *H03K 5/1252* (2013.01); *H03B 5/04* (2013.01); *H03B 5/08* (2013.01)

(58) Field of Classification Search
CPC ........... H03K 5/1252; H03K 5/04; H03K 5/08
USPC ........................................................ 327/156
See application file for complete search history.

(56) References Cited

U.S. PATENT DOCUMENTS

| | | | |
|---|---|---|---|
| 4,862,485 A | 8/1989 | Guinea et al. | |
| 5,663,105 A | 9/1997 | Sua et al. | |
| 5,748,949 A | 5/1998 | Johnston | |
| 5,757,240 A | 5/1998 | Boerstler et al. | |
| 5,903,195 A | 5/1999 | Lukes et al. | |
| 6,219,797 B1 | 4/2001 | Liu et al. | |
| 6,259,327 B1 | 7/2001 | Balistreri et al. | |
| 6,640,311 B1 | 10/2003 | Knowles | |
| 6,643,787 B1 | 11/2003 | Zerbe et al. | |
| 6,650,193 B2 | 11/2003 | Endo et al. | |
| 6,683,506 B2 | 1/2004 | Ye et al. | |
| 6,727,767 B2 | 4/2004 | Takada et al. | |
| 6,768,387 B1 | 7/2004 | Masuda et al. | |
| 6,959,066 B2 | 10/2005 | Wang et al. | |
| 7,012,476 B2 | 3/2006 | Ogiso et al. | |
| 7,323,916 B1 | 1/2008 | Sidiropoulos et al. | |
| 7,405,594 B1 | 7/2008 | Xu et al. | |
| 7,434,083 B1 | 10/2008 | Wilson et al. | |
| 7,541,848 B1 | 6/2009 | Masuda et al. | |
| 7,545,188 B1 | 6/2009 | Xu et al. | |
| 7,573,303 B1 | 8/2009 | Chi et al. | |

(Continued)

OTHER PUBLICATIONS

"19-Output PCIE GEN 3 Buffer", Si53019-A01A, Silicon Laboratories Inc., Rev. 1.1 May 2015, 34 Pages.

(Continued)

*Primary Examiner* — Ryan Jager
(74) *Attorney, Agent, or Firm* — Glass & Associates; Kenneth Glass; Mark Peloquin

(57) ABSTRACT

An integrated circuit to remove jitter from a clock signal includes an integrated circuit die. The integrated circuit die includes a signal comparator. The signal comparator is configured to determine a frequency difference between a jittery input clock signal and a correction signal. A digital low pass filter is coupled to receive and filter the frequency difference and to provide a filtered output signal. A free running crystal-less oscillator produces a reference signal. A fractional output divider is coupled to the free running crystal-less oscillator and the digital low pass filter. The fractional output divider utilizes the filtered output signal to establish a value to divide the reference signal by to obtain a clean output clock signal. The clean output clock signal is fed back to the signal comparator and is used as the correction signal.

12 Claims, 7 Drawing Sheets

(56) References Cited

U.S. PATENT DOCUMENTS

| | | |
|---|---|---|
| 7,586,347 B1 | 9/2009 | Ren et al. |
| 7,590,163 B1 | 9/2009 | Miller et al. |
| 7,671,635 B2 | 3/2010 | Fan et al. |
| 7,737,739 B1 | 6/2010 | Bi et al. |
| 7,741,981 B1 | 6/2010 | Wan et al. |
| 7,750,618 B1 | 7/2010 | Fang et al. |
| 7,786,763 B1 | 8/2010 | Bal et al. |
| 7,816,959 B1 | 10/2010 | Isik et al. |
| 7,907,625 B1 | 3/2011 | MacAdam et al. |
| 7,928,880 B2 | 4/2011 | Tsukamoto |
| 7,941,723 B1 | 5/2011 | Lien et al. |
| 8,018,289 B1 | 9/2011 | Hu et al. |
| 8,164,367 B1 | 4/2012 | Bal et al. |
| 8,179,952 B2 | 5/2012 | Thurston et al. |
| 8,188,796 B2 * | 5/2012 | Zhu .................. H03L 7/0992 327/159 |
| 8,259,888 B2 | 9/2012 | Hua et al. |
| 8,284,816 B1 | 10/2012 | Clementi et al. |
| 8,305,154 B1 | 11/2012 | Kubena et al. |
| 8,416,107 B1 | 4/2013 | Wan et al. |
| 8,432,231 B2 * | 4/2013 | Nelson .................. B60Q 1/444 327/156 |
| 8,436,677 B2 | 5/2013 | Kull et al. |
| 8,456,155 B2 * | 6/2013 | Tamura .............. G01R 31/2822 257/107 |
| 8,471,751 B2 | 6/2013 | Wang |
| 8,537,952 B1 | 9/2013 | Arora et al. |
| 8,693,557 B1 | 4/2014 | Zhang et al. |
| 8,704,564 B2 | 4/2014 | Hasegawa et al. |
| 8,723,573 B1 | 5/2014 | Wang et al. |
| 8,791,763 B2 | 7/2014 | Taghivand |
| 8,896,476 B2 | 11/2014 | Harpe |
| 8,933,830 B1 | 1/2015 | Jeon |
| 8,981,858 B1 | 3/2015 | Grivna et al. |
| 9,077,386 B1 | 7/2015 | Holden et al. |
| 9,100,232 B1 | 8/2015 | Hormati et al. |
| 2002/0079937 A1 | 6/2002 | Xanthopoulos et al. |
| 2002/0191727 A1 | 12/2002 | Staszewski et al. |
| 2003/0042985 A1 | 3/2003 | Shibahara et al. |
| 2003/0184350 A1 | 10/2003 | Wang et al. |
| 2004/0136440 A1 | 7/2004 | Miyata et al. |
| 2004/0165691 A1 | 8/2004 | Rana et al. |
| 2006/0119402 A1 * | 6/2006 | Thomsen .............. H03L 7/0898 327/105 |
| 2006/0197614 A1 | 9/2006 | Roubadia et al. |
| 2006/0290391 A1 | 12/2006 | Leung et al. |
| 2007/0149144 A1 | 6/2007 | Beyer et al. |
| 2007/0247248 A1 | 10/2007 | Kobayashi et al. |
| 2008/0043893 A1 | 2/2008 | Nagaraj et al. |
| 2008/0104435 A1 | 5/2008 | Pernia et al. |
| 2008/0129351 A1 | 6/2008 | Chawla et al. |
| 2008/0246546 A1 | 10/2008 | Ha et al. |
| 2009/0083567 A1 | 3/2009 | Kim et al. |
| 2009/0140896 A1 | 6/2009 | Adduci et al. |
| 2009/0184857 A1 | 7/2009 | Furuta et al. |
| 2009/0231901 A1 | 9/2009 | Kim et al. |
| 2009/0256601 A1 | 10/2009 | Zhang et al. |
| 2009/0262567 A1 | 10/2009 | Shin et al. |
| 2010/0007427 A1 * | 1/2010 | Tomita .................. H03H 19/004 331/117 FE |
| 2010/0052798 A1 | 3/2010 | Hirai et al. |
| 2010/0090731 A1 | 4/2010 | Casagrande et al. |
| 2010/0164761 A1 | 7/2010 | Wan et al. |
| 2010/0194483 A1 | 8/2010 | Storaska et al. |
| 2010/0323643 A1 | 12/2010 | Ridgers et al. |
| 2011/0006936 A1 | 1/2011 | Lin et al. |
| 2011/0032013 A1 * | 2/2011 | Nelson .................. B60Q 1/444 327/156 |
| 2011/0234204 A1 * | 9/2011 | Tamura .............. G01R 31/2822 324/123 R |
| 2011/0234433 A1 | 9/2011 | Aruga et al. |
| 2011/0285575 A1 | 11/2011 | Landez et al. |
| 2011/0304490 A1 | 12/2011 | Janakiraman |
| 2012/0013406 A1 * | 1/2012 | Zhu .................. H03L 7/0992 331/34 |
| 2012/0161829 A1 | 6/2012 | Fernald et al. |
| 2012/0200330 A1 | 8/2012 | Kawagoe |
| 2012/0262315 A1 | 10/2012 | Kapusta et al. |
| 2012/0297231 A1 | 11/2012 | Qawami et al. |
| 2012/0317365 A1 | 12/2012 | Elhamias et al. |
| 2012/0328052 A1 | 12/2012 | Etemadi et al. |
| 2013/0002467 A1 | 1/2013 | Wang |
| 2013/0162454 A1 | 6/2013 | Lin |
| 2013/0194115 A1 | 8/2013 | Wu et al. |
| 2013/0211758 A1 | 8/2013 | Prathapan et al. |
| 2014/0029646 A1 | 1/2014 | Foxcroft et al. |
| 2014/0210532 A1 | 7/2014 | Jenkins et al. |
| 2014/0327478 A1 | 11/2014 | Horng et al. |
| 2014/0347941 A1 | 11/2014 | Jose et al. |
| 2015/0162921 A1 | 6/2015 | Chen et al. |
| 2015/0180594 A1 | 6/2015 | Chakraborty et al. |
| 2015/0200649 A1 | 7/2015 | Trager et al. |
| 2016/0084895 A1 | 3/2016 | Imhof |
| 2016/0119118 A1 | 4/2016 | Shokrollahi et al. |
| 2016/0162426 A1 | 6/2016 | Benjamin et al. |
| 2016/0211929 A1 | 7/2016 | Holden et al. |

OTHER PUBLICATIONS

"NB3W1200L: 3.3 V 100/133 MHz Differential 1:12 Push-Pull Clock ZDB/Fanout Buffer for PCIe", ON Semiconductor, http://onsemi.com, Aug. 2013, Rev. 0, 26 Pages.

Avramov, et al., "1.5-GHz Voltage Controlled Oscillator with 3% Tuning Bandwidth Using a Two-Pole DSBAR Filter", Ultrasonics, Ferroelectrics and Frequency Control. IEEE Transactions on. vol. 58., May 2011, pp. 916-923.

Hwang, et al., "A Digitally Controlled Phase-Locked Loop with a Digital Ohase—Frequency Detector for Fast Acquisition", IEEE Journal of Solid State Circuits, vol. 36, No. 10, Oct. 2001, pp. 1574-1581.

Kratyuk, et al., "Frequency Detector for Fast Frequency Lock of Digital PLLs", Electronic Letters, vol. 43, No. 1, Jan. 4, 2007, pp. 1-2.

Mansuri, "Fast Frequency Acquisition Phase-Frequency Detectors for GSamples/s Phase-Locked Loops", IEEE Journal of Solid-State Circuits, vol. 37 No. 10, Oct. 2002, pp. 1331-1334.

Nagaraju, "A Low Noise 1.5GHz VCO with a 3.75% Tuning Range Using Coupled FBAR's", IEEE International Ultrasonics Symposium (IUS), Oct. 2012, pp. 1-4.

Watanabe, "An All-Digital PLL for Frequency Multiplication by 4 to 1022 with Seven-Cycle Lock Time", IEEE Journal of Solid-State Circuits, vol. 39 No. 2, Feb. 2003, pp. 198-204.

Texas Instruments "CDCEx913 Programmable 1-PLL VCXO Clock Synthesizer With 1.8-V, 2.5-V, and 3.3-V Outputs", Apr. 2015, pp. 1-36, pp. 11, 20-22.

* cited by examiner

CRYSTAL-LESS JITTER ATTENUATOR

BACKGROUND OF THE INVENTION

1. Field of Invention

The invention relates generally to jitter attenuation, and more specifically to apparatuses and methods for low power, small footprint jitter attenuation.

2. Art Background

A data communication system utilizes a data communication channel such as is used with Ethernet (IEEE 802.3 standard), Universal Serial bus (USB,) High Definition Multimedia Interface (HDMI,) IEEE 1394 standard (known as the Apple, Inc. product Firewire®,) etc. protocols. A data communication channel uses a clock signal to provide timing. A clock signal can be encoded together with data and transmitted from point A to point B within the communication system. When the clock is recovered at point B it can contain noise, which is referred to in the art as "jitter." This can present a problem, since clock signals must be stable and present a waveform which does not change over time due to environmentally induced electromagnetic interference. The circuit used to remove jitter is referred to in the art as a jitter attenuator.

An existing jitter attenuator is illustrated in FIG. 1. In FIG. 1, a jittery input clock signal 104 is input to a phase detector 102. The output of the phase detector is low pass filtered by the loop filter and is input into an analog-to-digital converter (ND) 108. The output of the ND converter 108 is sent to a fractional N phase locked loop (N PLL) 110 and results in an upward or downward correction of the fractional N PLL 110 output frequency. The output of the fractional N PLL 110 is fed back at 106 to the phase detector 102. The output of the fractional N PLL 110 is either provided as clean output or is input to an output divider 114 and then output as clean output 116. The crystal 112 is located "off-chip" externally from the jitter attenuator integrated circuit die. A large die area results, power consumption is high, and cost to produce increases, all of this can present a problem.

SUMMARY

In various embodiments, an integrated circuit to remove jitter from a clock signal includes an integrated circuit die and a signal comparator. The signal comparator is configured to determine a frequency difference between a jittery input clock signal and a correction signal. The integrated circuit includes a digital low pass filter. The digital low pass filter is coupled to receive and filter the frequency difference and to provide a filtered output signal. The integrated circuit includes a free running crystal-less oscillator. The free running crystal-less oscillator produces a reference signal. The integrated circuit includes a fractional output divider. The fractional output divider is coupled to the free running crystal-less oscillator and the digital low pass filter. The fractional output divider utilizes the filtered output signal to establish a value to divide a frequency of the reference signal by to obtain a clean output clock signal. The clean output clock signal is fed back to the signal comparator and is used as the correction signal.

In some embodiments, the integrated circuit further includes a feedback divider. An input of the feedback divider is electrically coupled to receive the clean output clock signal. An output of the feedback divider provides the correction signal to the signal comparator. The feedback divider divides a frequency of the clean output clock signal by an integer to obtain the correction signal.

In one or more embodiments, the signal comparator is a frequency comparator. In other embodiments, the signal comparator is a phase detector. The phase detector determines a phase difference between the jittery input clock signal and the correction signal; the digital low pass filter receives and filters the phase difference to provide a filtered output signal. In some embodiments, the signal comparator is a time to digital converter. The time to digital converter determines a phase difference between the jittery input clock signal and the correction signal; the digital low pass filter receives and filters the phase difference to provide a filtered output signal.

In some embodiments, the integrated circuit of claim A1, includes a temperature sensor, the temperature sensor monitors a temperature of the free running crystal-less oscillator. An output of the temperature sensor and temperature compensation logic are used to produce a correction factor. A summer adds the correction factor to the filtered output signal to produce a corrected input signal; the corrected input signal is input to the fractional output divider to remove an effect of the temperature on a desired frequency of the clean output clock signal.

In one or more embodiments, the free running crystal-less oscillator is constructed with an LC oscillator. The LC oscillator is located on the integrated circuit die. In other embodiments, the free running crystal-less oscillator is constructed with a ring oscillator. The ring oscillator is located on the integrated circuit die. In some embodiments, a resonator of the free running crystal-less oscillator is located off of the integrated circuit die. In various embodiments, the resonator is an LC resonator, a ring resonator, a bulk acoustic wave resonator, a surface acoustic wave resonator, and a micro-electromechanical system resonator.

The clock signal is used in a communication channel which utilizes a protocol selected form the group consisting of Ethernet (IEEE 802.3 standard), Universal Serial bus (USB,) High Definition Multimedia Interface (HDMI,) IEEE 1394 standard (known as the Apple, Inc. product Firewire®,), etc.

In other embodiments, an integrated circuit to remove jitter from a clock signal includes a signal comparator. The signal comparator is configured to average a jittery input clock signal. The signal comparator determines a physical difference between the average of the jittery input clock signal and a correction signal. The integrated circuit includes a digital low pass filter. The digital low pass filter is coupled to receive and filter the physical difference and to provide a filtered output signal. The integrated circuit includes a free running crystal-less oscillator. The free running crystal-less oscillator produces a reference signal. The integrated circuit includes a fractional output divider. The fractional output divider is coupled to the free running crystal-less oscillator and the digital low pass filter. The fractional output divider utilizes the filtered output signal to establish a value to divide a frequency of the reference signal by to obtain a clean output clock signal; the clean output clock signal is fed back to the signal comparator and is used as the correction signal.

A method to remove jitter from a clock signal includes determining a physical difference between a jittery input clock signal and a correction signal. The physical difference is filtered to produce a low pass filtered output signal. The method further includes dividing a frequency of a free running crystal-less oscillator reference signal with a fractional output divider to produce a clean output clock signal, wherein the fractional output divider uses the physical difference to select a value for the dividing. The method further includes establishing a frequency relationship between the jittery input clock signal and the clean output clock signal. The method further includes feeding back the clean output clock signal for use while the physical difference is being determined; the clean output is used as the correction signal.

BRIEF DESCRIPTION OF THE DRAWINGS

The invention may best be understood by referring to the following description and accompanying drawings that are used to illustrate embodiments of the invention. The invention is illustrated by way of example in the embodiments and is not limited in the figures of the accompanying drawings, in which like references indicate similar elements.

DETAILED DESCRIPTION

In the following detailed description of embodiments of the invention, reference is made to the accompanying drawings in which like references indicate similar elements, and in which is shown by way of illustration, specific embodiments in which the invention may be practiced. These embodiments are described in sufficient detail to enable those of skill in the art to practice the invention. In other instances, well-known circuits, structures, and techniques have not been shown in detail in order not to obscure the understanding of this description. The following detailed description is, therefore, not to be taken in a limiting sense, and the scope of the invention is defined only by the appended claims.

A crystal-less jitter attenuator is described. The crystal-less jitter attenuator is made on a single chip using various embodiments of the invention. Embodiments of the invention can be used to create a low power small footprint circuit which can be made at a cost that is lower than prior jitter attenuators.

Figure 1:
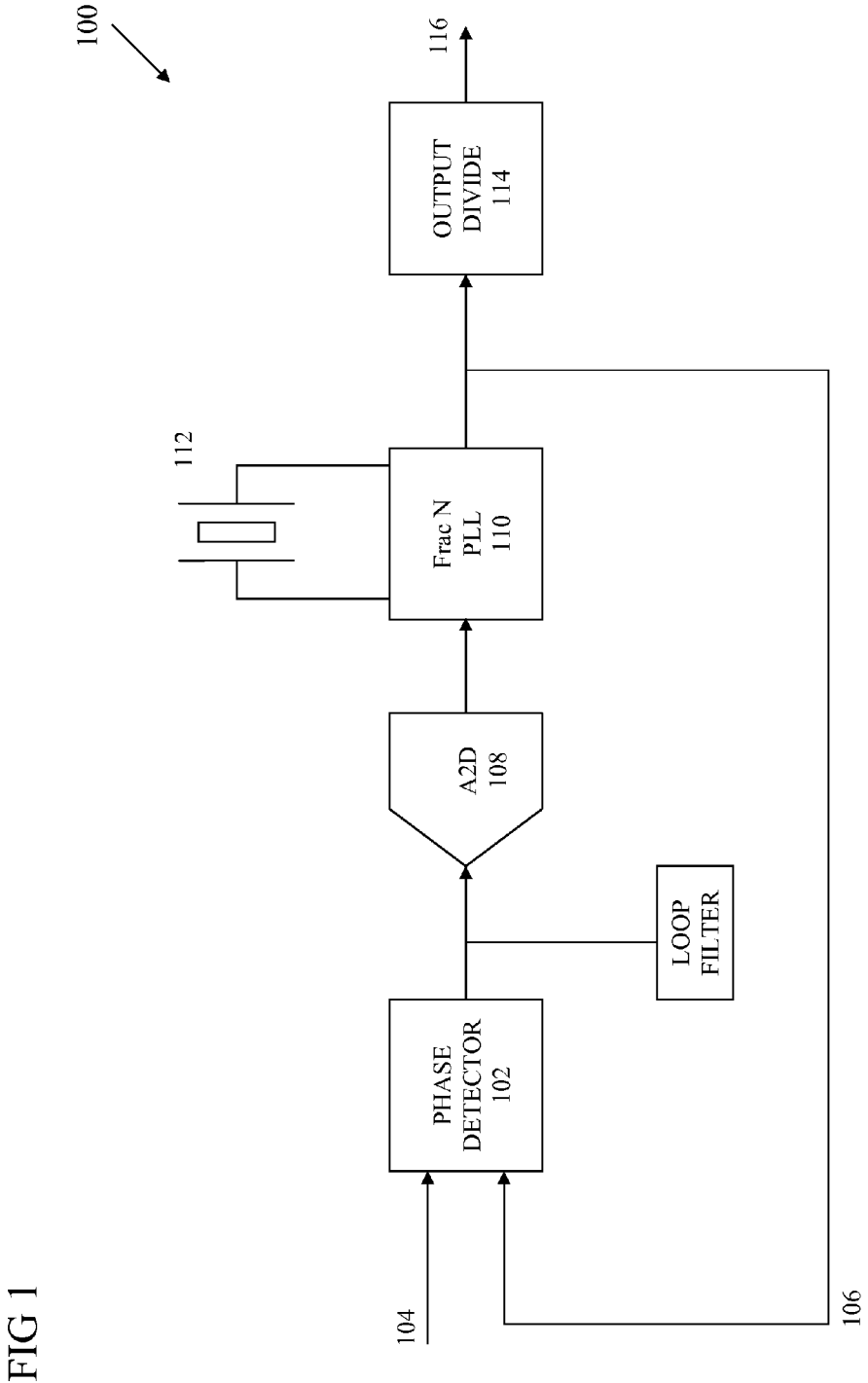
FIG. 1 shows a circuit for an existing jitter attenuator.
Figure 2A:
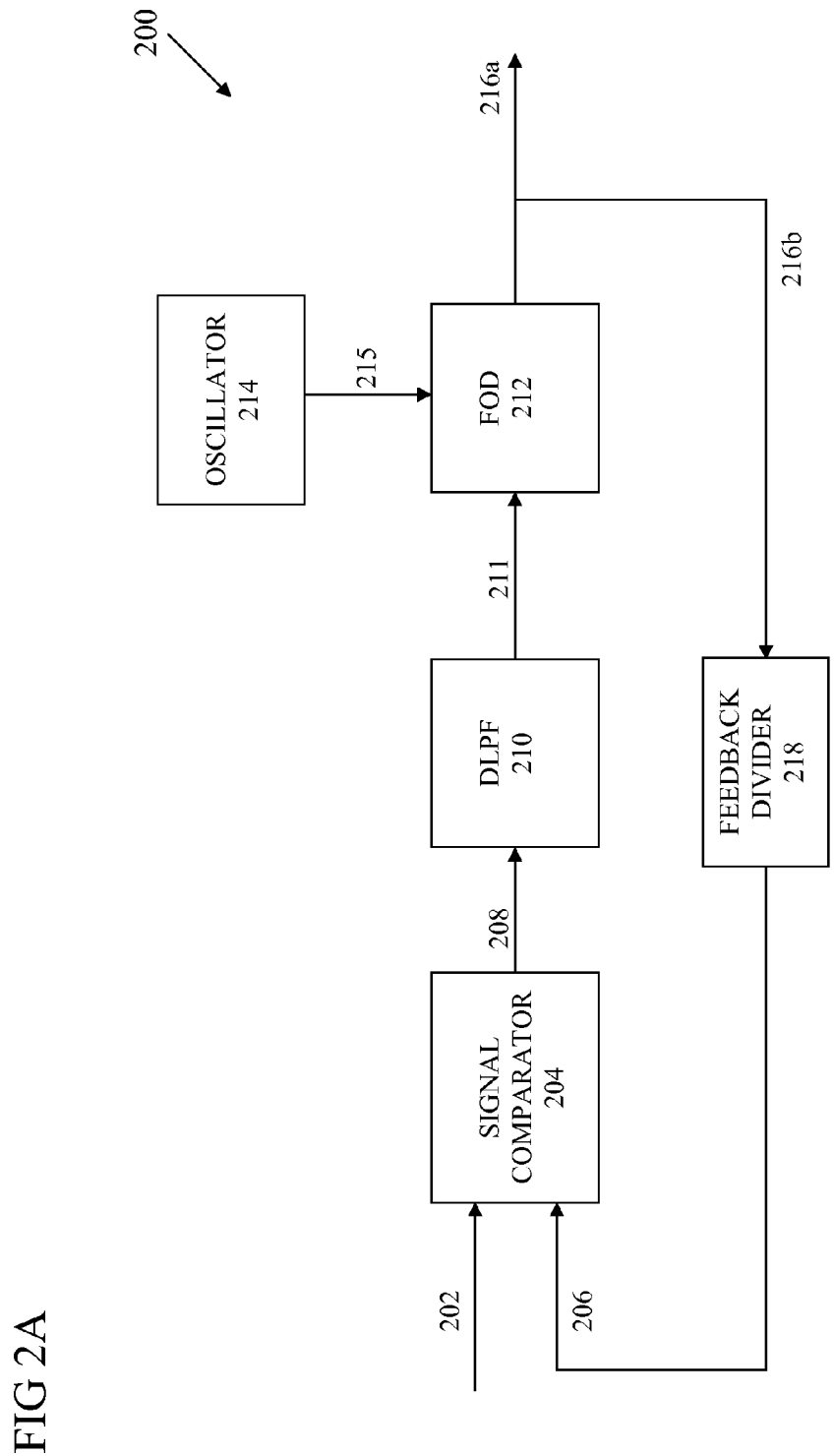
FIG. 2A illustrates a jitter attenuator, according to embodiments of the invention.

FIG. 2A illustrates, generally at 200, a jitter attenuator, according to embodiments of the invention. With reference to FIG. 2A, a jittery input clock signal 202 and a correction signal 206 are input to a signal comparator 204. As used in this description of embodiments, the term "jittery input clock signal" is used synonymously with the term "jittery input," for clarity in presentation. An output of the signal comparator 204 is input to a digital low pass filter (DLPF) 210. A filtered output signal 211 of the DLPF 210 is input to a fractional output divider (FOD) 212. A free running crystal-less oscillator 214 has an output 215 which is also an input to the FOD 212. As used in this description of embodiments, "free running crystal-less oscillator" is used synonymously with the term "crystal-less oscillator," for clarity in presentation. However, "free running" means that the resonant frequency of the free running crystal-less oscillator is not changed while different frequencies are obtained for the clean output clock signal. An output 216a of the FOD 212 is referred to as "clean output" or equivalently as "clean output clock signal" since the jitter has been attenuated from this signal relative to the jittery input clock signal 202. The clean output clock signal 216b is input to an optional feedback divider 218. An output of the optional feedback divider 218 is fed back as the correction signal 206. In embodiments where the feedback divider 218 is not used, the clean output clock signal 216b is fed back as the correction signal 206. Note that 216a and 216b are equivalent but have been labeled individually to facilitate the above description.

Jitter as used in this detailed description of embodiments refers to a deviation of a clock's output transition from an ideal position. Deviation of a clock's output transition can occur either on the leading edge or the trailing edge of the clock cycle or simultaneously on both edges of the clock cycle. Further description of jitter and its effect on a clock signal is provided below in conjunction with FIG. 2C. Jitter can be induced from several different sources and is not necessarily uniform over all frequencies. Jitter can arise from environmental sources such as electromagnetic interference (EMI) from nearby devices and equipment or it can arise from the communication channel itself, such as from changes in circuit impedance. Embodiments of the invention are not limited by the source of the jitter and these examples of jitter are provided merely for illustration of some aspects of the problem addressed by embodiments of the invention.

Referring to FIG. 2A, the signal comparator 204 compares the jittery input clock signal 202 with a correction signal 206 in the time domain to determine a physical difference between the two signals. A physical difference can be a frequency difference or a phase difference between the two signals. In one or more embodiments, a signal comparator 204 is implemented as a phase detector or a time to digital converter (TDC) providing a phase locked loop (PLL) in 200 which drives the phase and frequency of the clean output clock signal 216a to match the long term average of the jittery input clock signal 202 (while the oscillator 214 is free running at a constant frequency), thereby attenuating the jitter from the clock signal at 216a. Long term average can be set according to system requirements; however some non-limiting examples are on the order of thousands of clock cycles. Embodiments of the invention are not limited by the number of clock cycles employed for the long-term average; however the specific number should be sufficiently large to eliminate the higher frequency fluctuations of the jittery input clock signal 202.

In yet other embodiments, the signal comparator 204 is a frequency comparator which compares the frequency between the jittery input clock signal 202 and the correction signal 206. The signal comparator 204 (frequency comparator) averages the number of clock cycles within a time window. Typically the time window is sized to permit thousands of clock cycles to be averaged, thereby providing a measure of low pass filtering. Utilizing a frequency comparator at 204 results in a frequency locked loop (FLL) 200 which drives the frequency of the clean output 216a to the long term average of the frequency of the jittery input 202 (while the oscillator 214 is free running at a constant frequency), thereby attenuating jitter from the clock signal at 216a. Any one of the devices used for comparison of the signals at 204 (in the PLL or FLL) is used together with the rest of the circuit in FIG. 2A as described below. A bandwidth for the resulting loop (PLL or FLL) is on the order of the sub-hertz range, e.g. tenths of hertz at the low end to the hertz range at the high end.

A free running crystal-less oscillator 214 has a characteristic resonant frequency $f_r$ which is adjusted externally from 214 by the fractional output divider (FOD) 212. As described above, even though $f_r$ is adjusted externally from FOD 212, FOD 212 does not change the characteristic resonant frequency $f_r$ of the free running oscillator 214. An output frequency of the FOD 212 is equal to $f_r/N$ where N is a floating point number. The jitter attenuator 200 is capable of operation over a very broad frequency range of input/output clock signals. For example, the jittery input clock signal 202 and clean output clock signal 216a can span a frequency range having a low end on the order of approximately a kilohertz (kHz) to hundreds of megahertz (MHz) at the high end. In practice, $f_r$ should be larger than the frequency of the jittery input clock signal 202 and sufficiently large to accommodate a desired frequency resolution for the system with consideration given to the frequency division provided at FOD 212. In one embodiment, $f_r$ is on the order of gigahertz and the frequency resolution of the fractional portion of the frequency value is equivalent to 24 bits.

During operation of the jitter attenuator 200 using a frequency comparator at 204 (FLL), comparison is made between the frequency of the correction signal 206 by counting the output clock cycles occurring within a fixed time window against the clock cycles occurring on the jittery input 202. The time window is sized to permit thousands of clock cycles to be averaged as described above. The frequency comparator determines a physical difference between the signals which is a frequency difference. If the frequency of the correction signal 206 is greater than the frequency of the jittery input 202, the FLL lowers the FOD 212 output frequency, which lowers the frequency of the clean output clock signal 216a. If the frequency of the correction signal 206 is lower than the frequency of the jittery input 202 then the FFL increases the FOD 212 output frequency, which increases the frequency of the clean output clock signal 216a.

The optional feedback divider 218 provides functionality which permits the frequency of the clean output clock signal 216a to be a multiple of the frequency of the jittery input clock signal 202, while maintaining phase match between the clean output clock signal 216a and the jittery input clock signal 202. The optional feedback divider 218 divides the output clock signal 216b of the FOD 212 by an integer M, thereby changing a frequency of the correction signal 206 relative to the frequency of the clean output clock signal 216a. In operation, a frequency relationship between the jittery input and the clean output is established as a system parameter; a control circuit utilizes the frequency relationship to establish the value of the integer M. For example, in one case in order to increase the frequency of the clean output clock signal 216a to be five times greater than the frequency of the jittery input clock signal 202 the feedback divider divides 216b by five, i.e., M=5. In another case, if it is desired to make the frequency of the clean output clock signal 216a equal to the frequency of the jittery input clock signal 202 the feedback divider divides by one, i.e., M=1.

In various embodiments, the free running crystal-less oscillator 214 is implemented utilizing an LC (inductor capacitor) circuit or a ring oscillator, non-limiting examples of both are illustrated by way of circuit diagrams in FIG. 4 below. Free running crystal-less oscillator 214 is implemented on the same die as the jitter attenuator. Utilizing a crystal-less oscillator at 214 on the same die eliminates an external oscillator, which has historically been a crystal oscillator, and the added circuit complexity (extra footprint, power, and cost) needed to support the external off-chip architecture of the external oscillator.

Figure 2B:
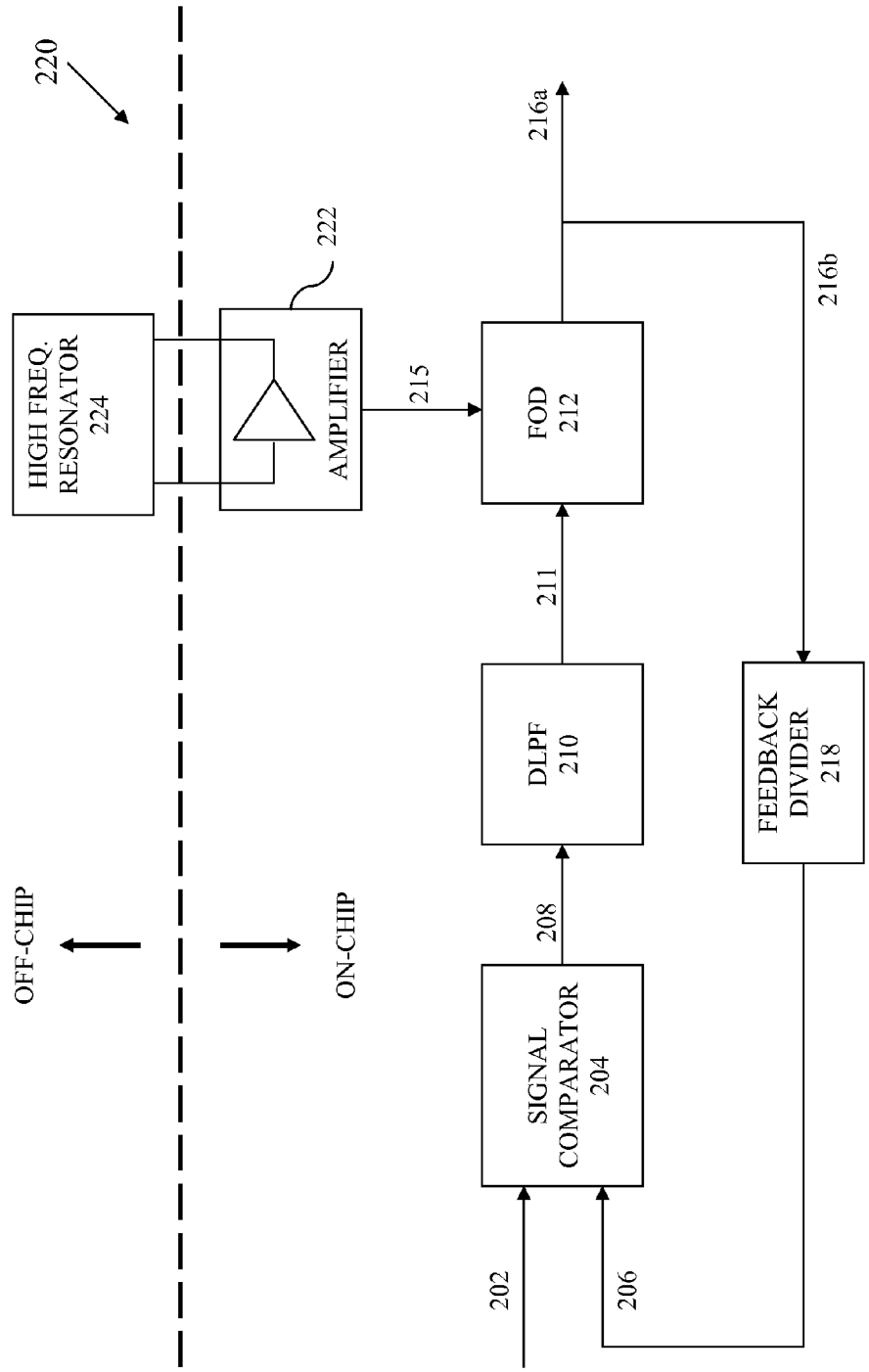
FIG. 2B illustrates a jitter attenuator with a free running resonator element, according to embodiments of the invention.

FIG. 2B illustrates, generally at 220, a jitter attenuator with a free running crystal-less resonator element, according to embodiments of the invention. With reference to FIG. 2B, the jitter attenuator from FIG. 2A is illustrated where the functionality of the oscillator 214 is divided between the jitter attenuator die and a second die which is external to the jitter attenuator die. In FIG. 2B, a free running crystal-less resonator element 224 is located externally (off-chip) from the jitter attenuator die. Amplifier 222 which is electrically coupled to the free running crystal-less resonator element 224 is located on the jitter attenuator die (on-chip). In various embodiments, the external free running crystal-less resonator element 224 is made using an LC resonator, a ring oscillator, a Bulk Acoustic Wave (BAW) resonator, a Surface Acoustic Wave (SAW) resonator, or a Micro-electromechanical System (MEMS) resonator.

The free running characteristic described above in conjunction with FIG. 2A is maintained in the design of the jitter attenuators illustrated with FIG. 2B. The off-chip free running crystal-less resonator element 224 is typically designed with a characteristic resonant frequency $f_r$ in the gigahertz range, in some embodiments approximately 2 gigahertz. A specific resonant frequency is application dependent and the example of 2 gigahertz is provided merely for illustration and does not limit embodiments of the invention.

In various embodiments, the jitter attenuator 200 is implemented in an integrated circuit device, which may include an integrated circuit package containing the integrated circuit. In some embodiments, the jitter attenuator 200 is implemented in a single integrated circuit die. In other embodiments, the jitter attenuator 200 is implemented in more than one integrated circuit die of an integrated circuit device which may include a multi-chip package containing the integrated circuit. The embodiments of the present invention are not limited to any particular semiconductor manufacturing technology. Embodiments of the present invention can be implemented using C-MOS, BIPOLAR, Silicon Germanium, or other process technology. The process technologies listed here are provided merely for example and do not limit embodiments of the invention.

Figure 2C:
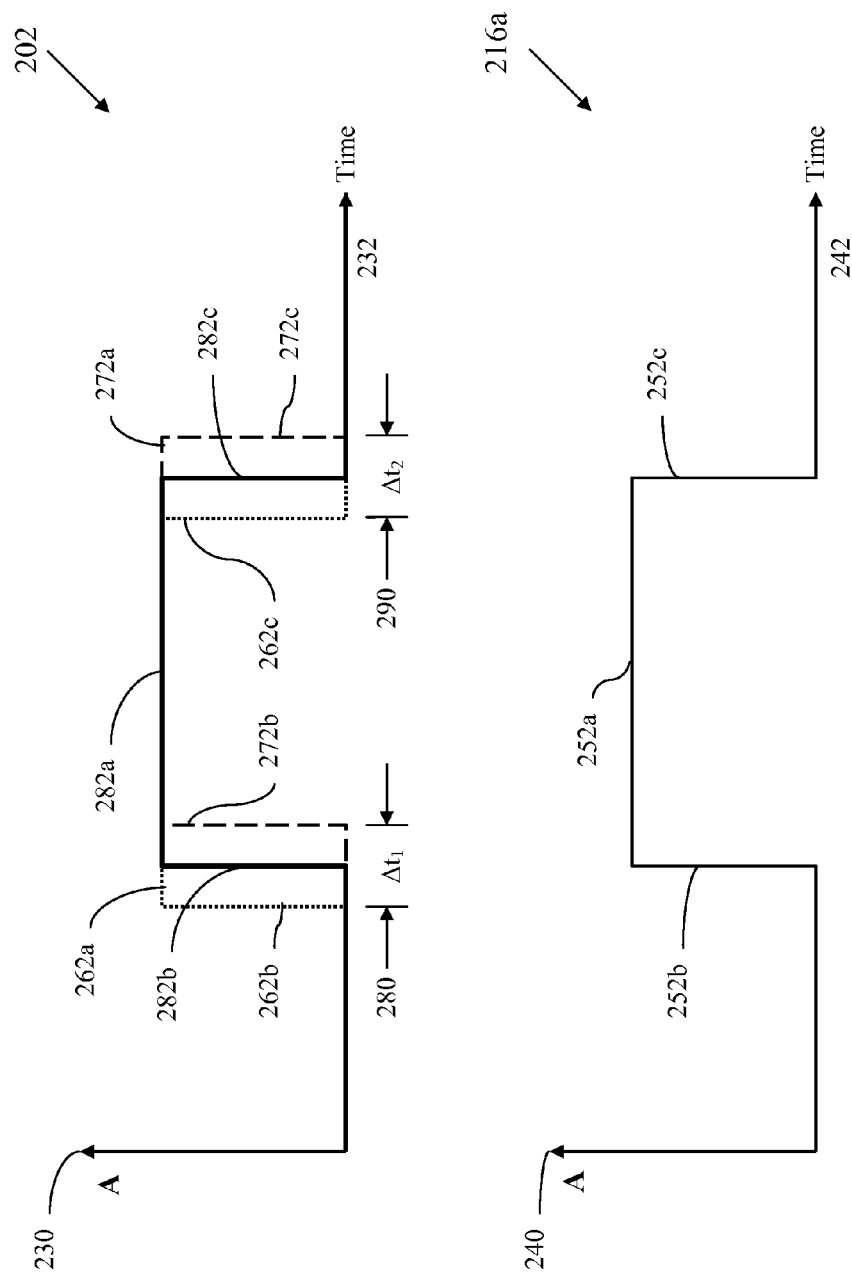
FIG. 2C illustrates jitter waveforms in the time domain, according to embodiments of the invention.

FIG. 2C illustrates, generally at 202, jitter waveforms in the time domain, according to embodiments of the invention. With reference to FIG. 2C, the jitter waveforms shown at 202 can represent the jittery input clock signal 202 from FIG. 2A or FIG. 2B for a plurality of clock cycles superimposed over each other. Amplitude is plotted on the vertical axis 230 and is indicated by the letter "A." Time is plotted on the horizontal axis 232. A clock waveform 282a illustrates an ideal position in time which has a first edge location at 282b and a second edge location at 282c without jitter. A second clock waveform 262a is superimposed on the plot in 202 and has a first edge 262b and a second edge 262c. Similarly, a third clock waveform 272a is superimposed on the plot in 202 and has a first edge at 272b and a second edge at 272c. The second waveform (262a/262b/262c) and the third waveform (272a/272b/272c) are used to indicate the edges of a jitter envelope as shown having a width of $\Delta t_1$ at 280 and at $\Delta t_2$ at 290.

The clean output signal clock signal 216a from FIG. 2A or FIG. 2B is illustrated in FIG. 2C at 216a with amplitude indicated by the letter "A" on a vertical axis 240 and time indicated on a horizontal axis 242. The clean output waveform 216a has amplitude 252a, a first edge 252b and a second edge 252c. In various embodiments, the jitter attenuator described above in conjunction with FIG. 2A or FIG. 2B accepts a jittery input clock signal 202 having a frequency $f_{clock}$. The jitter attenuator attenuates the jitter illustrated in FIG. 2C at 202 by creating and outputting a signal, clean output clock signal 216a, having a frequency which is equivalent to a long term average of the frequency of the jittery input clock signal, $f_{clock}$. In cases where a frequency divider is used the clean output clock signal 216a will have a frequency which is a multiple of the long term average of the jittery input clock signal 202 (the frequency multiple is not shown in FIG. 2C). The loop (PLL or FLL) filter bandwidth is adjustable and is tailored to the requirements for a given system. A loop filter bandwidth is set by a given system design and is typically in the sub-hertz to hertz range as discussed above.

Figure 3:
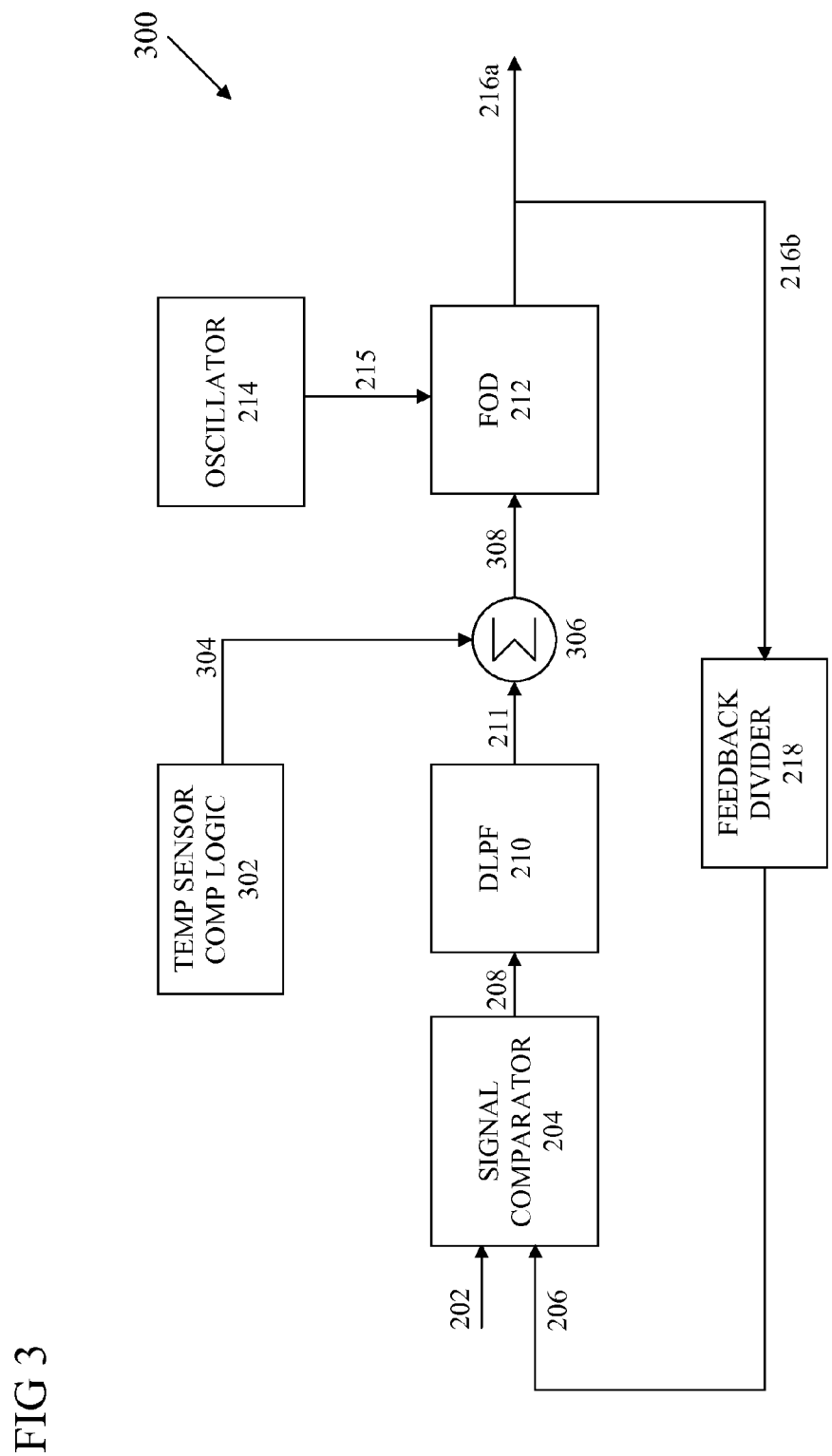
FIG. 3 illustrates temperature compensation of a jitter attenuator, according to embodiments of the invention.

FIG. 3 illustrates, generally at 300, temperature compensation of a jitter attenuator, according to embodiments of the invention. As described above, the bandwidth of the jitter attenuator is low by design. Therefore, fluctuations in critical system parameters that occur quickly will be not be corrected by the system due to the low bandwidth. An example of such a "quick" fluctuation is a temperature fluctuation that changes the oscillator frequency. A temperature fluctuation can occur from physically moving the jitter attenuator for example from an indoor location at a first temperature to an outdoor location at a second temperature. Therefore, optional temperature compensation functionality is added to the circuit of FIG. 2B resulting in the circuit shown in FIG. 3. With reference to FIG. 3, a temperature sensor and temperature compensation logic are indicated at 302. The temperature sensor is located to sense the same temperature that the crystal-less oscillator experiences, such as mounting the temperature sensor on the semi-conductor die for example. A priori information on the variation of the crystal-less oscillator's frequency with temperature is part of the information used by the temperature compensation logic. The temperature compensation logic uses temperature changes that occur over short time intervals and the crystal-less oscillator's frequency/temperature response to output a correction factor indicated at 304. The correction factor 304 is input into a summer 306. The summer 306 sums the correction factor 304 together with the filtered output signal 211 of the digital low pass filter 210 to output a corrected input signal 308 to the FOD 212. The corrected input signal 308 will allow the FOD 212 to perform division of the frequency of the signal output at 215 from the crystal-less oscillator 214 so that the effect of the free running crystal-less oscillator 214's change in frequency with temperature is removed from the clean output clock signal 216a.

In the embodiments described above in FIG. 2B, which locate the free running crystal-less resonator off-chip, in some implementations a temperature sensor from 302 is located on the integrated circuit die with the free running crystal-less resonator. In other implementations the temperature sensor from 302 is located on the jitter attenuator die.

Figure 4:
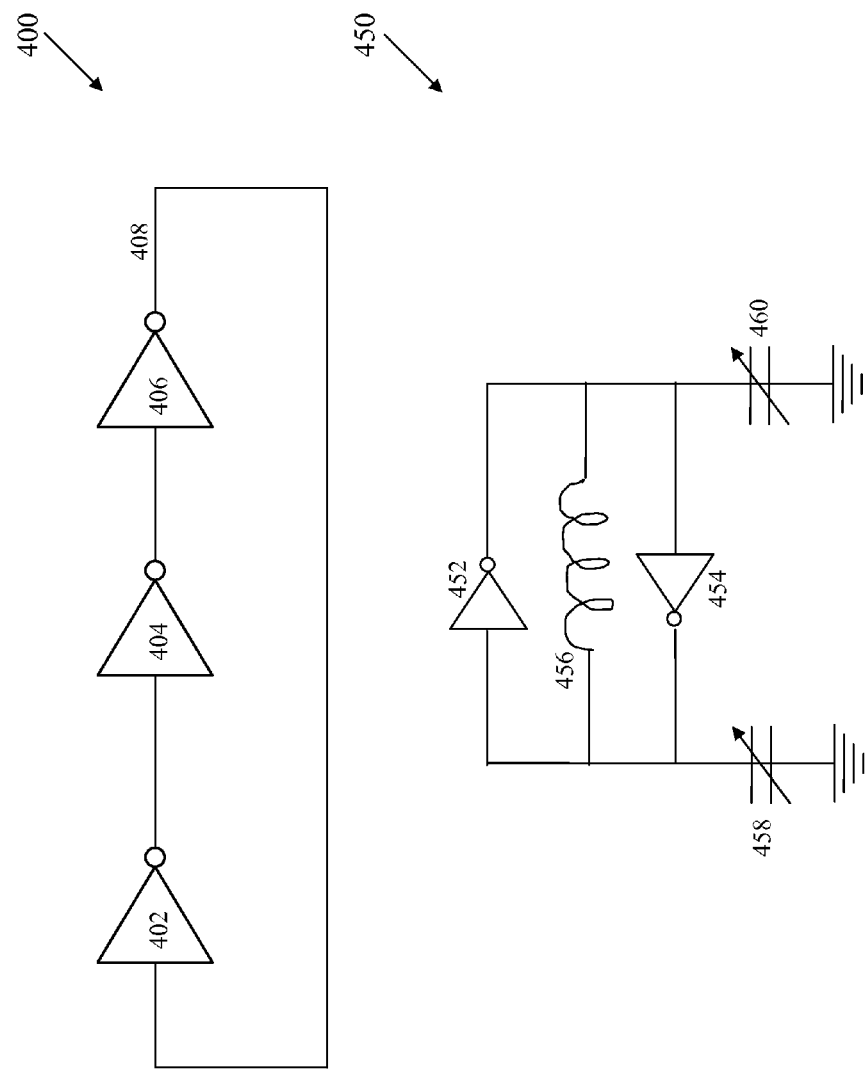
FIG. 4 illustrates on chip oscillators, according to embodiments of the invention.

FIG. 4 illustrates on chip crystal-less oscillators, according to embodiments of the invention. With reference to FIG. 4, several different implementations for the free running crystal-less oscillator 214 (e.g., FIG. 2A) are illustrated. In one embodiment, a circuit diagram for a ring oscillator is shown at 400. The ring oscillator is constructed with a series configuration of an odd number of inverters. In the example of FIG. 4, three inverters are shown by way of non-limiting example, with an output of the last inverter in the ring 406 connected as the input into the first inverter 402 on the ring.

Alternatively, in another embodiment, an LC oscillator can be used for the free running crystal-less oscillator 214 (FIG. 2A). With reference to FIG. 4, one configuration of an LC oscillator is illustrated at 450. LC oscillator 450 is configured with inverters 452, 454, inductor 456, and capacitors 458 and 460. In various embodiments, different configurations of an LC oscillator are used. The circuits presented at 400 and 450 in FIG. 4 are provided merely as examples and do not limit embodiments of the invention.

Figure 5:
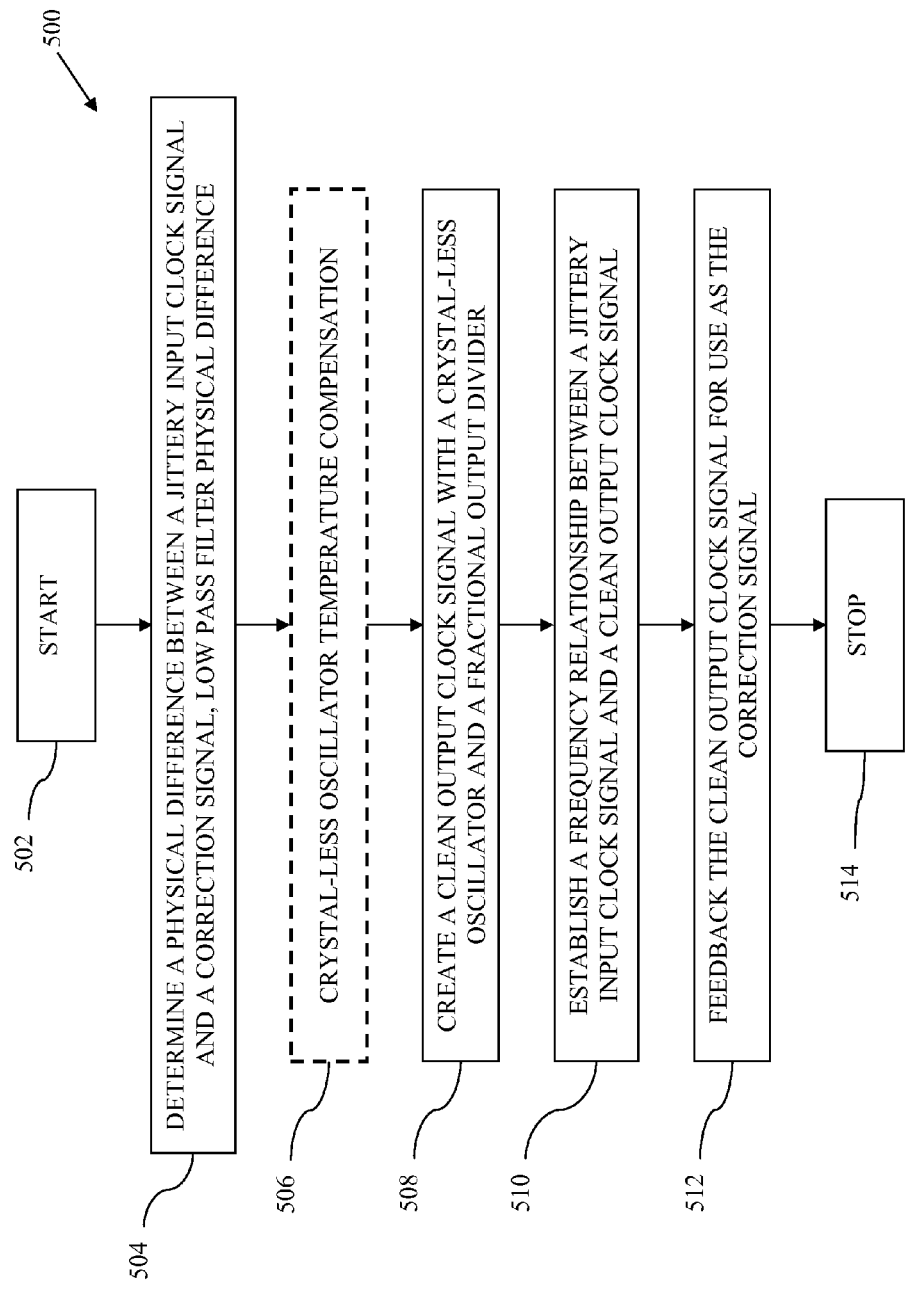
FIG. 5 illustrates a process for jitter attenuation according to embodiments of the invention.

FIG. 5 illustrates, generally at 500, a process for jitter attenuation according to embodiments of the invention. With reference to FIG. 5, a process starts at a block 502. At a block 504 a physical difference between signals is determined and is low pass filtered. The physical difference can be a phase difference or a frequency difference or a combination of the two as described above in conjunction with signal comparator 204 (FIG. 2A). Optionally at a block 506 a temperature induced frequency change of a free running crystal-less oscillator is compensated for. Techniques for temperature compensation are described above in conjunction with FIG. 3. At a block 508 a clean output clock signal is created using a crystal-less free running oscillator and a fractional output divider. Using a free running crystal-less oscillator and the fractional output divider (FOD) to create a clean output clock signal is described above in conjunction with FIG. 2A. Free running crystal-less oscillators are described above in conjunction with FIG. 2A, FIG. 2B, FIG. 3, and FIG. 4. At a block 510 a frequency relationship between a clean output clock signal and a jittery input clock signal is established. Use of a feedback divider to establish a frequency relationship between a frequency of a clean output clock signal and the frequency of a jittery input clock signal is described above in conjunction with FIG. 2A, FIG. 2B, and FIG. 3. At a block 512 a correction signal is fed back to use as the correction signal. The process stops at a block 514.

In various embodiments, integrated circuits and methods have been described which attenuate jitter from a clock signal. Such embodiments are used to reduce jitter from clock signals used in communication channels that implement communication protocols such as Ethernet (IEEE 802.3 standard), Universal Serial bus (USB,) High Definition Multimedia Interface (HDMI,) IEEE 1394 standard (known as the Apple, Inc. product Firewire®,), etc.

For purposes of discussing and understanding the embodiments of the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory. These algorithmic descriptions and representations are the means used by those of ordinary skill in the data processing arts to most effectively convey the substance of their work to others of ordinary skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk-read only memories (CD-ROMs), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of media suitable for storing electronic instructions either local to the computer or remote to the computer.

Any of the methods according to the present invention can be implemented in hard-wired circuitry (e.g., integrated circuit(s)), by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, set top boxes, network PCs, minicomputers, mainframe computers, and the like. The invention can also be practiced in distributed computing environments where tasks are performed by remote processing devices that are linked through a communications network.

The methods herein may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of ordinary skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

Non-transitory machine-readable media is understood to include any mechanism for storing information in a form readable by a machine (e.g., a computer). For example, a machine-readable medium, synonymously referred to as a computer-readable medium, includes read only memory (ROM); random access memory (RAM); magnetic disk storage media; optical storage media; flash memory devices; except electrical, optical, acoustical or other forms of transmitting information via propagated signals (e.g., carrier waves, infrared signals, digital signals, etc.); etc.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

While the invention has been described in terms of several embodiments, those of skill in the art will recognize that the invention is not limited to the embodiments described, but can be practiced with modification and alteration within the spirit and scope of the appended claims. The description is thus to be regarded as illustrative instead of limiting.

What is claimed is:

1. An integrated circuit to remove jitter from a clock signal, comprising:
   an integrated circuit die, further comprising:
      a signal comparator, the signal comparator is configured to determine a frequency difference between a jittery input clock signal and a correction signal, wherein the signal comparator is a frequency comparator that counts a first number of clock cycles occurring on the correction signal within a fixed time window, and the frequency comparator counts a second number of clock cycles occurring on the jittery input clock signal within the fixed window of time;

a digital low pass filter, the digital low pass filter is coupled to receive and filter the frequency difference and to provide a filtered output signal;

a free running crystal-less oscillator, the free running crystal-less oscillator produces a reference signal; and a fractional output divider, the fractional output divider is coupled to the free running crystal-less oscillator and the digital low pass filter, the fractional output divider utilizes the filtered output signal to establish a value to divide a frequency of the reference signal by to obtain a clean output clock signal, the clean output clock signal is fed back to the signal comparator as the correction signal.

2. An integrated circuit to remove jitter from a clock signal, comprising:

an integrated circuit die, further comprising:

a signal comparator, the signal comparator is configured to determine a frequency difference between a jittery input clock signal and a correction signal;

a digital low pass filter, the digital low pass filter is coupled to receive and filter the frequency difference and to provide a filtered output signal;

a free running crystal-less oscillator, the free running crystal-less oscillator produces a reference signal;

a fractional output divider, the fractional output divider is coupled to the free running crystal-less oscillator and the digital low pass filter, the fractional output divider utilizes the filtered output signal to establish a value to divide a frequency of the reference signal by to obtain a clean output clock signal, the clean output clock signal is fed back to the signal comparator as the correction signal; and wherein the signal comparator is a time to digital converter, the time to digital converter determines a phase difference between the jittery input clock signal and the correction signal, the digital low pass filter receives and filters the phase difference to provide the filtered output signal.

3. The integrated circuit of claim 2, wherein the free running crystal-less oscillator is constructed with an LC oscillator, the LC oscillator is located on the integrated circuit die.

4. The integrated circuit of claim 2, wherein the free running crystal-less oscillator is constructed with a ring oscillator, the ring oscillator is located on the integrated circuit die.

5. The integrated circuit of claim 2, wherein a resonator of the free running crystal-less oscillator is selected from the group consisting of an LC resonator, a ring resonator, a bulk acoustic wave resonator, a surface acoustic wave resonator, and a micro-electromechanical system resonator.

6. The integrated circuit of claim 2, where the clock signal is used in a communication channel which utilizes a protocol selected form the group consisting of Ethernet (IEEE 802.3 standard), Universal Serial Bus (USB,) High Definition Multimedia Interface (HDMI,) and IEEE 1394 standard.

7. An integrated circuit to remove jitter from a clock signal, comprising:

a signal comparator, the signal comparator is configured to average a jittery input clock signal, the signal comparator determines a physical difference between an average of the jittery input clock signal and a correction signal;

a digital low pass filter, the digital low pass filter is coupled to receive and filter the physical difference and to provide a filtered output signal;

a free running crystal-less oscillator, the free running crystal-less oscillator produces a reference signal;

a fractional output divider, the fractional output divider is coupled to the free running crystal-less oscillator and the digital low pass filter, the fractional output divider utilizes the filtered output signal to establish a value to divide a frequency of the reference signal by to obtain a clean output clock signal, the clean output clock signal is fed back to the signal comparator as the correction signal;

a temperature sensor, the temperature sensor monitors a temperature of the free running crystal-less oscillator;

temperature compensation logic, an output of the temperature sensor and the temperature compensation logic are used to produce a correction factor; and a summer, the summer adds the correction factor to the filtered output signal to produce a corrected input signal, the corrected input signal is input to the fractional output divider to remove an effect of the temperature on a desired frequency of the clean output clock signal.

8. The integrated circuit of claim 7, wherein the integrated circuit is formed on an integrated circuit die and further wherein a resonator of the free running crystal-less oscillator is located off of the integrated circuit die.

9. A method to remove jitter from a clock signal, comprising:

determining a physical difference between a jittery input signal and a correction signal, wherein the physical difference is a phase difference obtained with a time to digital converter;

filtering the physical difference to produce a low pass filtered output signal;

dividing a frequency of a free running crystal-less oscillator reference signal with a fractional output divider to produce a clean output clock signal, wherein the fractional output divider uses the physical difference to select a value for the dividing;

establishing a frequency relationship between the jittery input clock signal and the clean output clock signal; and feeding back the clean output clock signal to the determining wherein the clean output clock signal is used as the correction signal.

10. A method to remove jitter from a clock signal, comprising:

determining a physical difference between a jittery input signal and a correction signal;

filtering the physical difference to produce a low pass filtered output signal;

dividing a frequency of a free running crystal-less oscillator reference signal with a fractional output divider to produce a clean output clock signal, wherein the fractional output divider uses the physical difference to select a value for the dividing;

establishing a frequency relationship between the jittery input clock signal and the clean output clock signal;

feeding back the clean output clock signal to the determining wherein the clean output clock signal is used as the correction signal;

measuring a temperature of the free running crystal-less oscillator; and using the temperature with temperature compensation logic to modify the filtered output signal so that an effect of the temperature on a desired frequency of the clean output clock signal is removed.

11. The method of claim 10 wherein the clock signal is used in a communications channel.

12. The method of claim 11, wherein the communication channel utilizes a protocol selected form the group consisting of Ethernet (IEEE 802.3 standard), Universal Serial Bus (USB,) High Definition Multimedia Interface (HDMI,) and IEEE 1394 standard.

* * * * *